(12) United States Patent
Enomoto et al.

(10) Patent No.: US 7,786,606 B2
(45) Date of Patent: Aug. 31, 2010

(54) RESIN-SEALED ELECTRONIC DEVICE AND METHOD OF MANUFACTURING THE SAME

(75) Inventors: Mitsuyasu Enomoto, Anjo (JP); Haruo Kawakita, Okazaki (JP); Takashi Ohno, Kariya (JP)

(73) Assignee: Denso Corporation, Kariya, Aichi-Pref. (JP)

( * ) Notice: Subject to any disclaimer, the term of this patent is extended or adjusted under 35 U.S.C. 154(b) by 3 days.

(21) Appl. No.: 11/945,807

(22) Filed: Nov. 27, 2007

(65) Prior Publication Data

US 2008/0128920 A1 Jun. 5, 2008

(30) Foreign Application Priority Data

Dec. 5, 2006 (JP) .............................. 2006-328363

(51) Int. Cl.
*H01L 23/29* (2006.01)
(52) U.S. Cl. .................. 257/791; 257/459; 257/625; 257/676; 257/780; 257/782
(58) Field of Classification Search .................. 257/459, 257/625, 676, 779, 780, 782, 783, 791, E23.023, 257/E23.04, E21.51, E21.511
See application file for complete search history.

(56) References Cited

U.S. PATENT DOCUMENTS

| | | | | | |
|---|---|---|---|---|---|
| 4,558,510 | A | * | 12/1985 | Tani et al. | 438/127 |
| 5,635,756 | A | * | 6/1997 | Kohno et al. | 257/676 |
| 5,659,198 | A | * | 8/1997 | Okutomo et al. | 257/659 |
| 5,923,084 | A | * | 7/1999 | Inoue et al. | 257/712 |
| 6,121,542 | A | * | 9/2000 | Shiotsuka et al. | 136/256 |
| 6,194,665 | B1 | * | 2/2001 | Kuribayashi et al. | 174/120 R |
| 6,621,154 | B1 | * | 9/2003 | Satoh et al. | 257/684 |
| 2001/0020736 | A1 | * | 9/2001 | Nakazawa et al. | 257/678 |
| 2002/0011651 | A1 | * | 1/2002 | Ichinose | 257/666 |
| 2003/0159513 | A1 | * | 8/2003 | Nagahara et al. | 73/514.16 |
| 2004/0089928 | A1 | * | 5/2004 | Nakajima et al. | 257/678 |
| 2004/0207500 | A1 | * | 10/2004 | Fujiwara et al. | 336/178 |
| 2006/0063890 | A1 | * | 3/2006 | Kitahara et al. | 525/191 |
| 2007/0254410 | A1 | * | 11/2007 | Shinoda et al. | 438/127 |
| 2008/0265436 | A1 | * | 10/2008 | Kawabata et al. | 257/778 |
| 2009/0143511 | A1 | * | 6/2009 | Ikezawa et al. | 524/127 |

FOREIGN PATENT DOCUMENTS

| | | |
|---|---|---|
| JP | 2000-323624 | 11/2000 |
| JP | 2001-274303 | 10/2001 |

* cited by examiner

*Primary Examiner*—N Drew Richards
*Assistant Examiner*—Joannie A Garcia
(74) *Attorney, Agent, or Firm*—Nixon & Vanderhye PC

(57) ABSTRACT

A resin-sealed semiconductor device includes a metal frame, an electronic substrate, an adhesive agent, a molded resin, and a bonding agent. The electronic substrate includes a first surface having a circuit element wiring part, a second surface facing the metal frame, and a side surface arranged approximately perpendicularly to the first surface and the second surface. The adhesive agent is disposed between the metal frame and the second surface to cover the second surface and a portion of the side surface adjacent to the second surface. The molded resin covers the metal frame and the electronic substrate, and holds the other portion of the side surface adjacent to the first surface. The bonding agent is disposed between the circuit element wiring part and the molded resin so that the molded resin holds the circuit element wiring part through the bonding agent.

18 Claims, 6 Drawing Sheets

RESIN-SEALED ELECTRONIC DEVICE AND METHOD OF MANUFACTURING THE SAME

CROSS REFERENCE TO RELATED APPLICATION

This application is based on Japanese Patent Application No. 2006-328363 filed on Dec. 5, 2006, the content of which is incorporated herein by reference in its entirety.

FIELD OF THE INVENTION

The present invention relates to a resin-sealed electronic device and a method of manufacturing the same.

BACKGROUND OF THE INVENTION

Conventionally, a resin-sealed electronic device is formed by attaching an electronic substrate on a metal frame and sealing the electronic substrate and the metal frame with a molded resin. On an upper surface of the electronic substrate, various circuit elements and bonding wires are arranged. The bonding wires connect the circuit elements to each other and connect the circuit elements and conductive pins. The upper surface of the electronic substrate is covered with a sheet of rubber, e.g., silicone, for protecting the circuit elements and the bonding wires from a thermal stress of the molded resin.

When a lower surface of the electric substrate is attached on the metal frame with an adhesive agent, a flowing end portion of the adhesive agent flows from the lower surface to a side surface of the electronic substrate, and thereby a fillet part as a flowing-out part of the adhesive agent is provided. When the fillet part covers the whole surface of the side surface, the molded resin cannot hold the side surface directly. Thus, when the resin-sealed electronic device receives a vibration or a thermal stress, the adhesive agent and the molded resin are detached from each other from an edge portion of the upper surface of the electronic substrate, i.e., an end portion of the fillet part. Thereby, the molded resin may not protect the circuit elements and the bonding wires.

To counter the above problem, JP-2000-323624A discloses a semiconductor device that includes a semiconductor chip and a resin substrate. The semiconductor chip is flip-chip mounted on a surface of the resin substrate through an underfill resin. The amount of the underfill resin is determined so that a length of a fillet part formed on a side surface of the semiconductor chip is longer than a distance between the surface of the resin substrate and an upper surface of the semiconductor chip in a direction approximately perpendicular to the surface of the resin substrate. Thereby, when the underfill resin is cured, a warpage of the resin substrate is reduced, and the underfill resin is not detached from the resin substrate.

Alternatively, JP-2001-274303A discloses a semiconductor device that includes a substrate and a heat sink attached to a surface of the substrate through an adhesive agent. The heat sink has an adhesive-agent cavity for preventing an adhesive agent from flowing out from between the substrate and the heat sink.

Either of the above-described semiconductor devices cannot protect circuit elements and bonding wires.

SUMMARY OF THE INVENTION

It is therefore an object of the present invention to provide a resin-sealed semiconductor device and/or a method of manufacturing a resin-sealed semiconductor device.

According to a first aspect of the invention, a resin-sealed semiconductor device includes a metal frame, an electronic substrate, an adhesive agent, a molded resin, and a bonding wire. The electronic substrate is disposed on the metal frame and includes a first surface having thereon a circuit element wiring part, a second surface facing the metal frame and having thereon a resistor pattern, and a side surface arranged approximately perpendicularly to the first surface and the second surface. The adhesive agent is disposed between a surface of the metal frame and the second surface of the electronic substrate to cover the second surface and a portion of the side surface adjacent to the second surface. The molded resin covers the metal frame and the electronic substrate and holds the other portion of the side surface adjacent to the first surface. The bonding agent has adhesiveness to the circuit element wiring part and the molded resin, and is disposed between the circuit element wiring part and the molded resin so that the molded resin holds the circuit element wiring part through the bonding agent.

In the resin-sealed semiconductor device, the adhesive agent is disposed only at the portion of the side surface adjacent to the second surface, and the molded resin directly holds the other portion of the side surface adjacent to the first surface. Thus, even when the resin-sealed electronic device receives a vibration or a thermal stress is generated in the molded resin, the molded resin is not detached from an edge portion of the first surface.

Additionally, the bonding agent strongly fixes the molded resin to the circuit element wiring part. Thus, even when the molded resin is detached from the edge portion of the first surface of the electronic substrate, the detachment does not proceed to a boundary between the circuit element wiring part and the molded resin.

According to a second aspect of the invention, a resin-sealed semiconductor device includes a metal frame, an electronic substrate, an adhesive agent, and a molded resin. The electronic substrate includes a first surface, a second surface arranged approximately parallel to the first surface and facing the metal frame, and a side surface arranged approximately perpendicularly to the first surface and the second surface. The adhesive agent is disposed between a surface of the metal frame and the second surface of the electronic substrate to cover the second surface and a portion of the side surface adjacent to the second surface. The molded resin covers the metal frame and the electronic substrate and holding the other portion of the side surface adjacent to the first surface. The metal frame has an adhesive-agent storing part on the surface thereof for storing the adhesive agent that flows out from between the second surface of the electronic substrate and the surface of the metal frame. The adhesive-agent storing part overlaps an outer end portion of the second surfaces.

Due to the adhesive-agent storing part, the adhesive agent can flow to the portion of the side surface adjacent to the second surface, and the adhesive agent does not spread on the metal frame beyond the adhesive-agent storing part. Additionally, the adhesive agent is covers only the portion of the side surface adjacent to the second surface, and the molded resin directly holds the other portion of the side surface adjacent to the first surface. Thus, even when the resin-sealed electronic device receives a vibration or a thermal stress is generated in the molded resin, the molded resin is not detached from an edge portion of the first surface.

According to a third aspect of the invention, a resin-sealed semiconductor device includes an electronic substrate having a circuit element wiring part on a surface thereof, a molded resin covering the electronic substrate, and bonding agent has adhesiveness to the circuit element wiring part and the molded resin. The boning agent is disposed between the circuit element wiring part and the molded resin so that the molded resin holds the circuit element wiring part through the bonding agent.

The bonding agent strongly fixes the molded resin to the circuit element wiring part. Thus, even when the molded resin is detached from an edge portion of the surface of the electronic substrate because the resin-sealed electronic device receives a vibration or a thermal stress is generated in the molded resin, the detachment does not proceed to a boundary between the circuit element wiring part and the molded resin.

According to a fourth aspect of the invention, a method of manufacturing a resin-sealed electronic device, includes: preparing an electronic substrate that includes a first surface having thereon a circuit element wiring part, a second surface having thereon a resistor pattern, and a side surface arranged approximately perpendicularly to the first surface and the second surface; applying an adhesive agent to the second surface of the electronic substrate, attaching the second surface of the electronic substrate on a surface of a metal frame that has an adhesive-agent storing part on the surface thereof, in which the adhesive-agent storing part is provided for storing the adhesive agent that flows out from between the second surface of the electronic substrate and the surface of the metal frame after the second surface is attached on the metal frame, so that a flowing end portion of the adhesive agent flows to a portion of the side surface adjacent to the second surface; applying a bonding agent to the circuit element wiring part; and molding a resin to cover the metal frame and the electronic substrate so that the molded resin holds the other portion of the side surface adjacent to the first surface and holds the circuit element wiring part through the bonding agent.

In the manufacturing method, the adhesive agent is applied to the second surface of the electronic substrate, and the electronic substrate is attached on the metal framed through the adhesive agent. Thereby, the adhesive agent covers the whole resistor pattern disposed on the second surface, and a flowing end portion of the adhesive agent that flows out from between the second surface and the surface of the metal frame flows to the side surface of the electronic substrate. The flowing end portion of the adhesive agent is stored in the adhesive-agent storing part, and thereby the flowing end portion is restricted from flowing to the other portion of the side surface adjacent to the first surface.

Additionally, the metal frame attached with the electronic substrate is covered by the molded resin. The molded resin holds the other portion of the side surface adjacent to the first surface, and holds the circuit element wiring part through the bonding agent. Thus, the present method can easily restrict a detachment between the electronic substrate and the molded resin.

BRIEF DESCRIPTION OF THE DRAWINGS

Additional objects and advantages of the present invention will be more readily apparent from the following detailed description of preferred embodiments when taken together with the accompanying drawings. In the drawings.

DETAILED DESCRIPTION OF THE PREFERRED EMBODIMENTS

Figure 1:
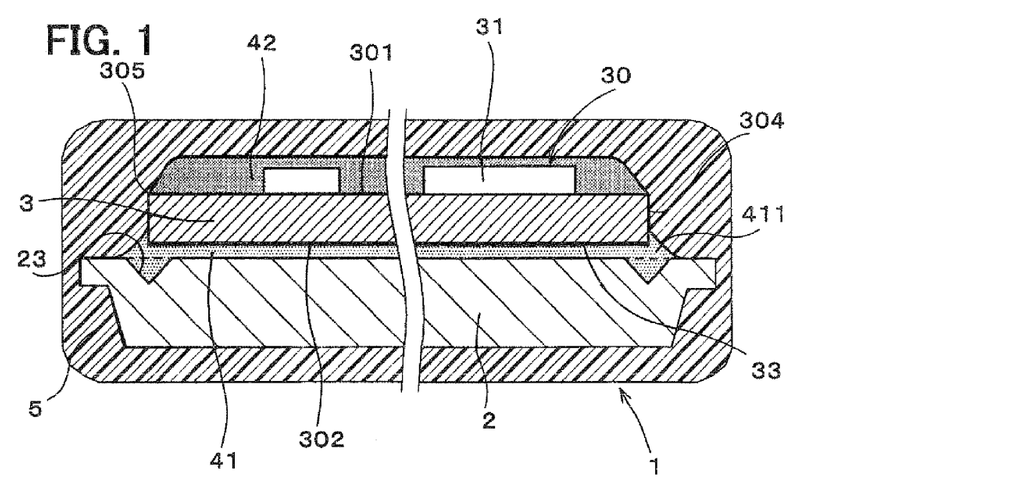
FIG. 1 is a schematic cross-sectional view showing a resin-sealed electronic device according to an embodiment of the invention.

Referring to FIG. 1, a resin-sealed electronic device according to an embodiment of the invention is shown as an igniter 1 for an ignition system of an engine, for example. The igniter 1 includes a metal frame 2, an electronic substrate 3 attached on the metal frame 2 through an adhesive agent 41, and a molded resin 5 covering the metal frame 2 and the electronic substrate 3. The electronic substrate 3 includes an upper surface 301 as a first surface having thereon a wiring part 30, a lower surface 302 as a second surface having thereon a resistor pattern 33, and a side surface 304 arranged perpendicularly to the upper surface 301 and the second surface 302. The wiring part 30 is covered with a bonding agent 42 that has adhesiveness to the wiring part 30 and the molded resin 5. The adhesive agent 41 is disposed to the lower surface 302 and a lower potion of the side surface 304 of the electronic substrate 3. The adhesive agent 41 has a fillet part 411 adjacent to the lower portion of the side surface 304. The fillet part 411 has an approximately triangular cross-sectional shape in which a thickness of the adhesive agent 41 disposed on the side surface 304 decreases toward an upper portion of the side surface 304.

The molded resin 5 holds the upper portion of the side surface 304. Additionally, the molded resin 5 holds the wiring part 30 through the bonding agent 42. The adhesive agent 41, the molded resin 5, and the bonding agent 42 are made of thermosetting resin. For example, the adhesive agent 41 is made of a silicone adhesive, the molded resin 5 is made of epoxy resin, and the bonding agent 42 is made of polyamide-imide resin. The material of the bonding agent 42 is determined so that the adhesiveness of the bonding agent 42 to the wiring part and the molded resin 5 is higher than adhesiveness between the wiring part 30 and the molded resin 5.

Figure 4:
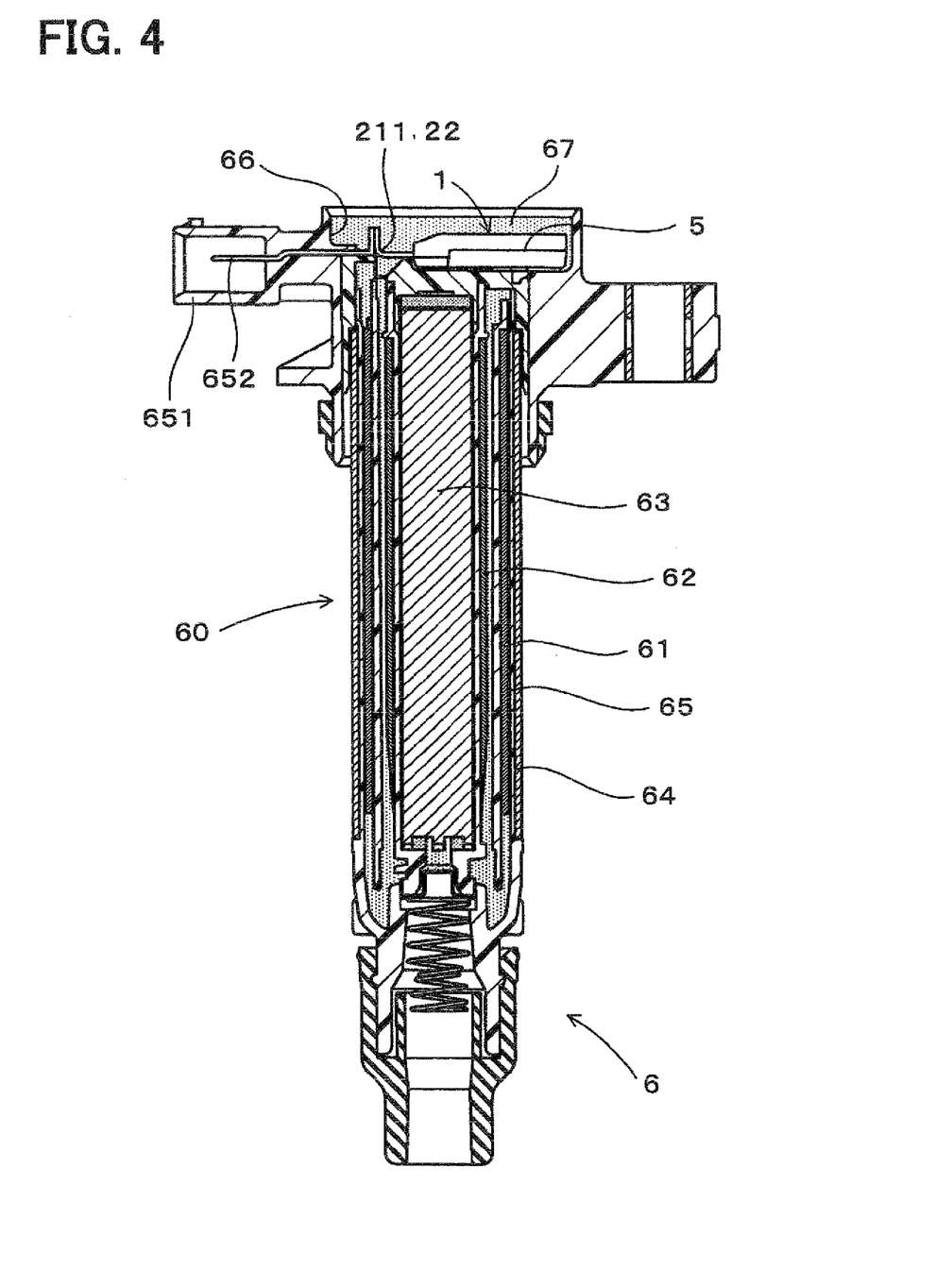
FIG. 4 is a cross-sectional view of an ignition coil including the resin-sealed electronic device.

As shown in FIG. 4, the igniter 1 is used for an ignition coil 6, for example. The ignition coil 6 is a stick type and has a coil part 60 disposed in a plughole in an engine (not shown). The coil part 60 includes a coil case 65, and a primary coil 61 and a secondary coil 62 are disposed in the coil case 65. The igniter 1 is built in the ignition coil 6, and is disposed at a portion of the coil case 65 which is disposed at an outside of the plughole.

The ignition coil 6 further includes a center core 63 and an outer peripheral core 64 made of a soft magnetic material. The center core 63 is disposed on an inner peripheral side of the primary coil 61 and the secondary coil 62, and the outer peripheral core 64 is disposed on an outer peripheral side of the primary coil 61 and the secondary coil 62. At an upper portion of the coil case 65, an igniter case 66 made of resin is arranged, and the igniter 1 is disposed in the igniter case 66. At a lower portion of the coil case 65, a spark plug (not shown) is attached. The spark plug generates a spark by using a high voltage current generated by the secondary coil 62. Clearances in the coil case 65 and the igniter case 66 are filled with an insulating resin, e.g., epoxy resin.

Figure 6:
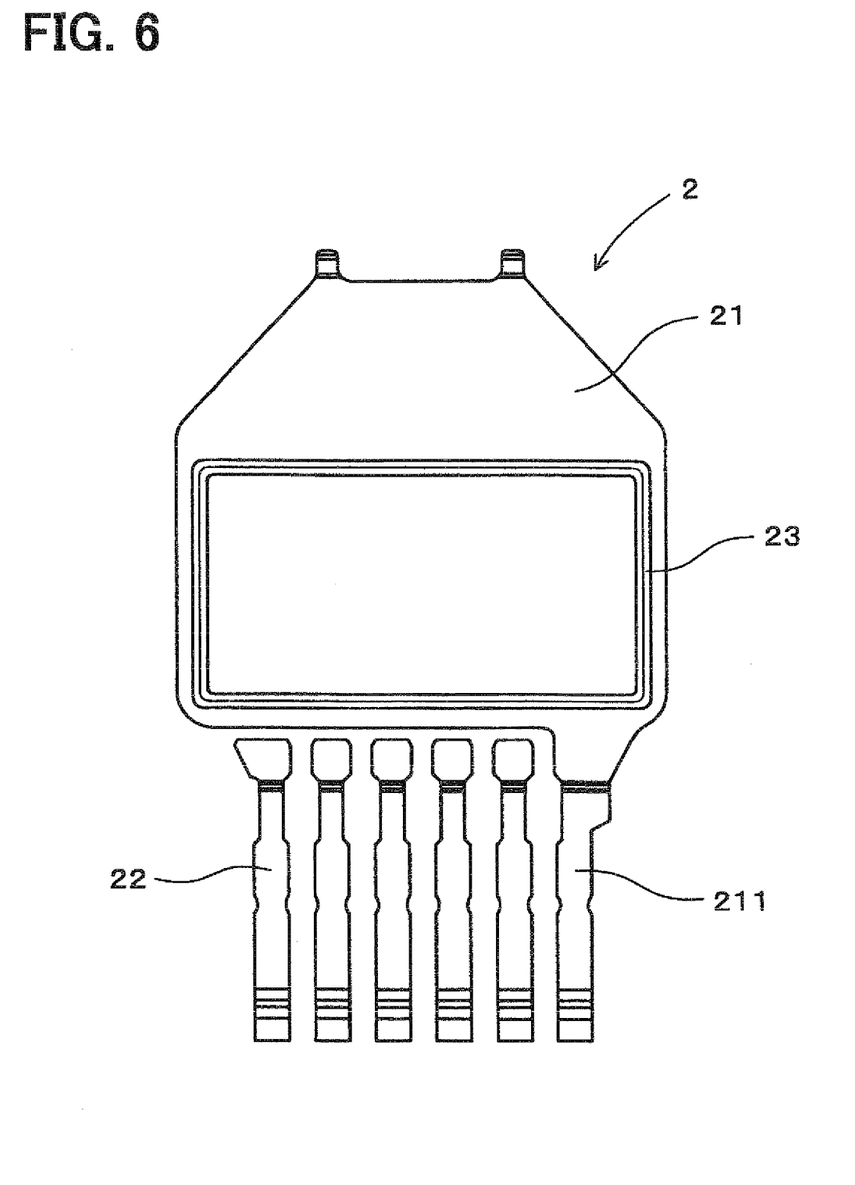
FIG. 6 is a plan view of the metal frame having a groove.

The igniter 1 has a ground pin 221 and a plurality of conductive pins 22 arranged to be parallel to the ground pin 221, as shown in FIG. 6. The ground pin 221 and the conductive pins 22 are electrically connected with connector side pins 652, and the connector pins 652 are electrically connected with an electronic control unit (ECU, not shown) of the engine through a wire harness. The primary coil 61 includes a primary spool and a primary winding wound around the primary spool. The secondary coil 62 includes a secondary spool and a secondary winding wound around the secondary spool. Each of the primary spool and the secondary spool is made of a thermoplastic material and having a ring shape in cross section. The secondary winding is smaller in diameter than the primary winding, and a winding number of the secondary winding is larger than that of the primary winding.

When the ECU generates a pulsed spark-generating signal and the primary coil 61 is supplied with electricity, a magnetic filed passing through the center core 63 and the outer peripheral core 64 is generated. When the electricity supply to the first coil 61 is stopped, an inductive magnetic field is generated. The inductive magnetic filed passes through the center core 63 and the outer peripheral core 64 in an opposing direction of that of the magnetic field. When the inductive magnetic field is generated, a high-voltage induced electromotive force (i.e., counter-electromotive force) is generated at the secondary coil 62. Thereby, the spark is generated between a pair of electrodes in the spark plug attached to the injection coil 6.

Figure 5:
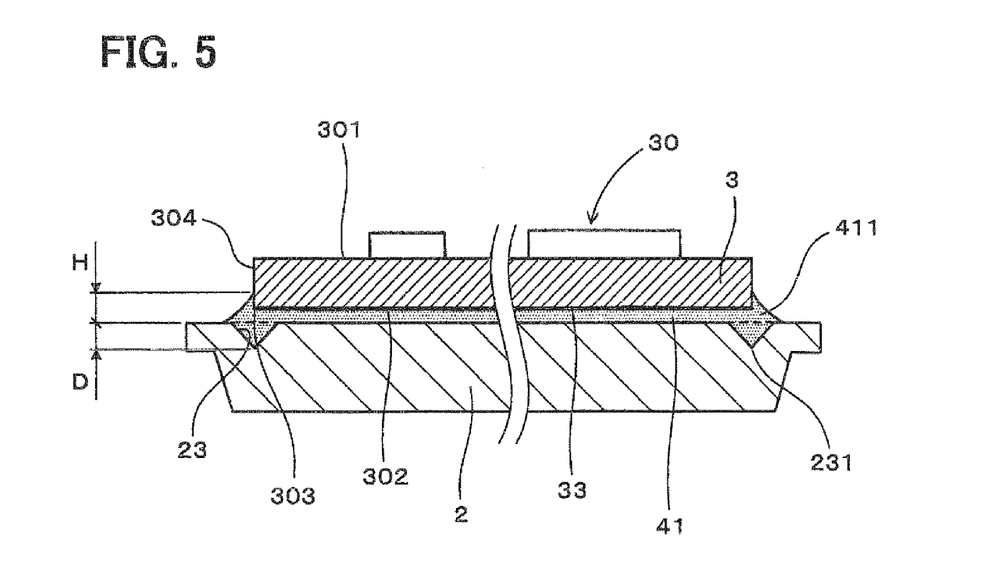
FIG. 5 is a cross-sectional view of an electronic substrate attached on a metal frame.

As shown in FIG. 5, the metal frame 2 has a groove 23 at a portion facing the lower surface 302 of the electronic substrate 3, for storing the adhesive agent 41 that flows out from between the lower surface 302 and the surface of the metal frame 2. As shown in FIGS. 5 and 6, the groove 23 is provided to have an annular shape at a portion of the metal frame 2 facing a lateral end part 303 of the lower surface 302. Specifically, the electronic substrate 3 has an approximately quadrangular plate shape, and the groove 23 is provided to have an approximately quadrangular annular shape along the shape of the electronic substrate 3. The groove 23 has a V-shape in cross section having a pair of inclined surfaces. For example, an angle between the inclined surfaces is about 90°, and a depth D of a bottom part 231 of the groove 23 is about 0.35 mm. The depth D may be set about in a range from 0.2 to 0.5 mm.

Figure 7:
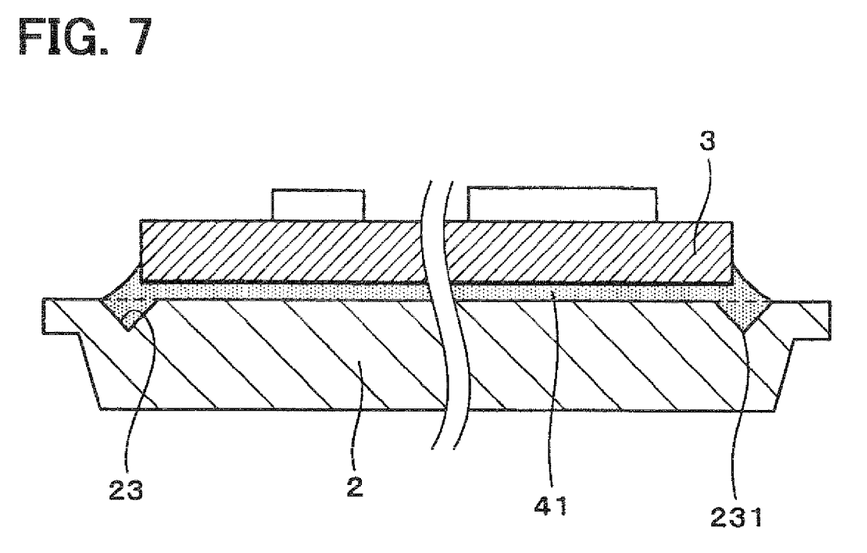
FIG. 7 is a cross-sectional view showing an example of a position of the groove with respect to an end portion of the electronic substrate.
Figure 8:
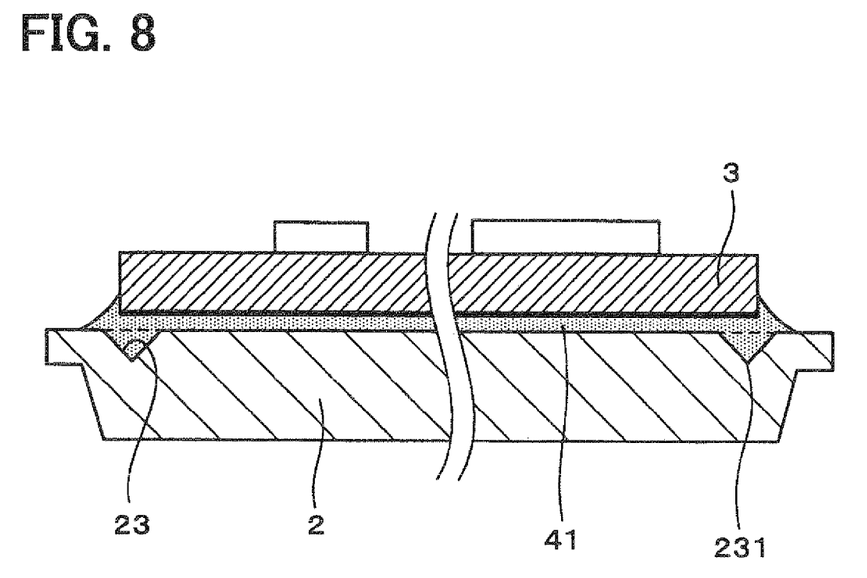
FIG. 8 is a cross-sectional view showing another example of the position of the groove with respect to the end portion of the electronic substrate.
Figure 9:
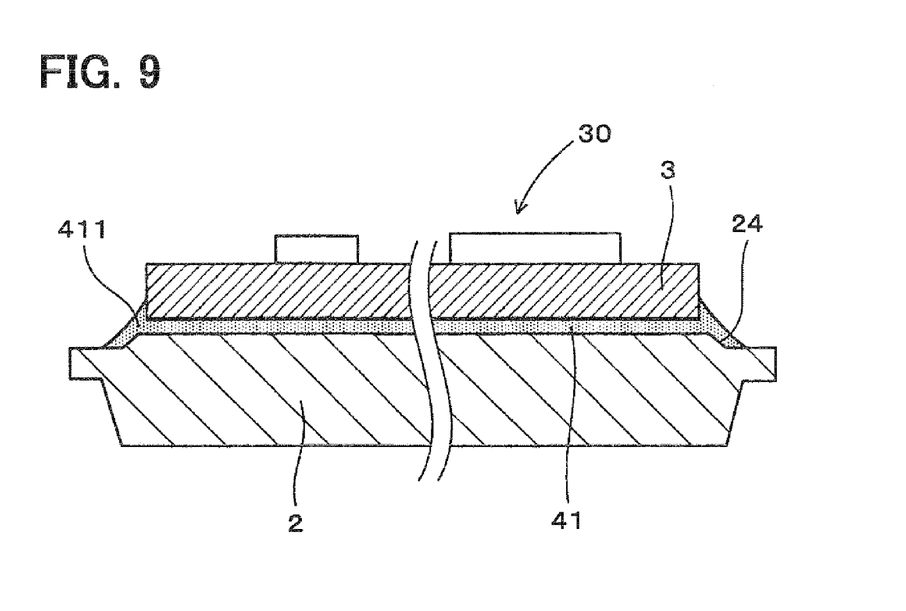
FIG. 9 is a cross-sectional view showing a metal frame having a stepped section.

For example, the bottom part 231 may be positioned just under the end part 303 of the lower surface 302. Alternatively, as shown in FIGS. 7 and 8, the bottom part 231 may be positioned on an outside or an inside with respect to the end part 303 in the lateral direction of the electronic substrate 3. Alternatively, as shown in FIG. 9, the metal frame 2 may have a stepped section 24 instead of the groove 23. The stepped section 24 may be stepped in a slope shape for storing the adhesive agent.

Figure 2:
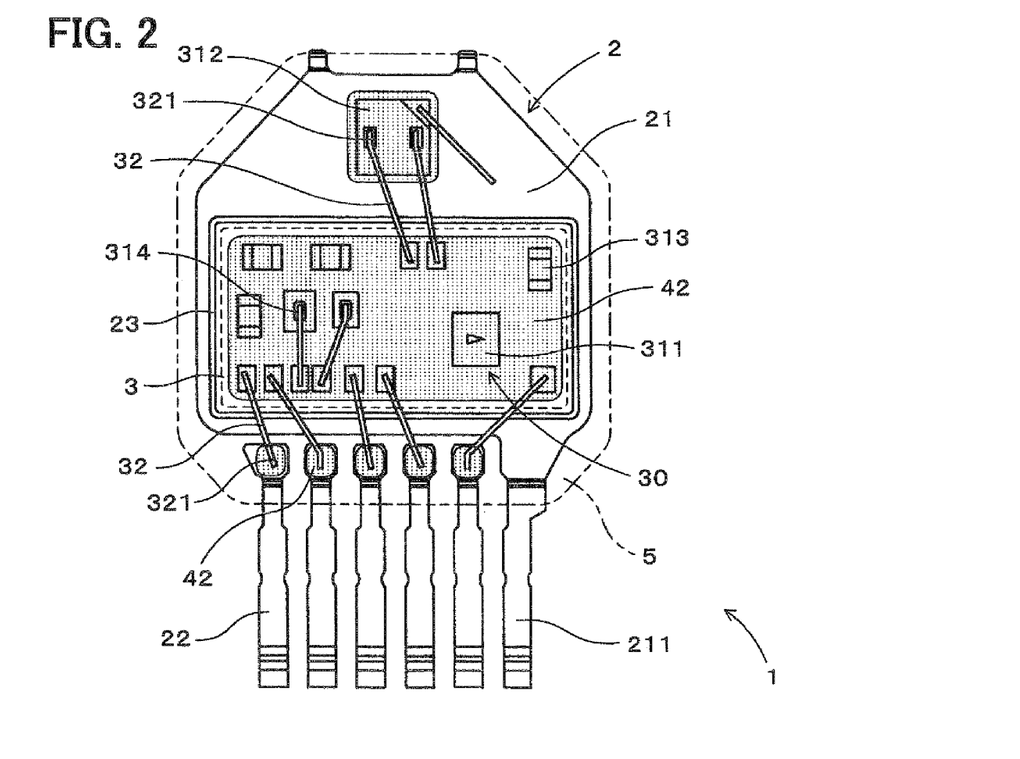
FIG. 2 is a plan view of the resin-sealed electronic device.

As shown in FIG. 2, the metal frame 2 includes a frame body 21, on which the electronic substrate 3 is disposed, the ground pin 211 extending from the frame body 21, and the conductive pins 22 arranged to be parallel to the ground pin 211. The ground pin 211 is used for setting a voltage of the metal frame 2 to a ground voltage. The conductive pins 22 function as a positive electric source, a negative electric source, a switching signal line, and a sensor signal line, respectively. As shown in FIG. 4, in a state where the igniter 1 is disposed in the igniter case 66, end portions of the ground pin 211 and the conductive pins 22 face end portions of the connector side pins 652 of the connector part 651, and are connected to each other by welding or soldering.

As shown in FIG. 2, the wiring part 30 includes bonding wires 32 and the circuit elements 31 such as an integrated circuit (IC) 311, a switching section 312 (e.g., transistor), capacitors 313, and diodes 314. The bonding wires 32 connect the circuit elements 31 to each other and connect the circuit elements 31 and end portions of the conductive pins 22. The IC 311, the capacitors 313, and the diodes 314 are disposed on the upper surface 301 of the electronic substrate 3, and the switching section 312 is directly disposed on the metal frame 2. The bonding agent 42 covers all the circuit elements 31 and all connecting portions 321 of the bonding wires 32 on a side of the upper surface 301 of the electronic substrate 3.

Figure 3:
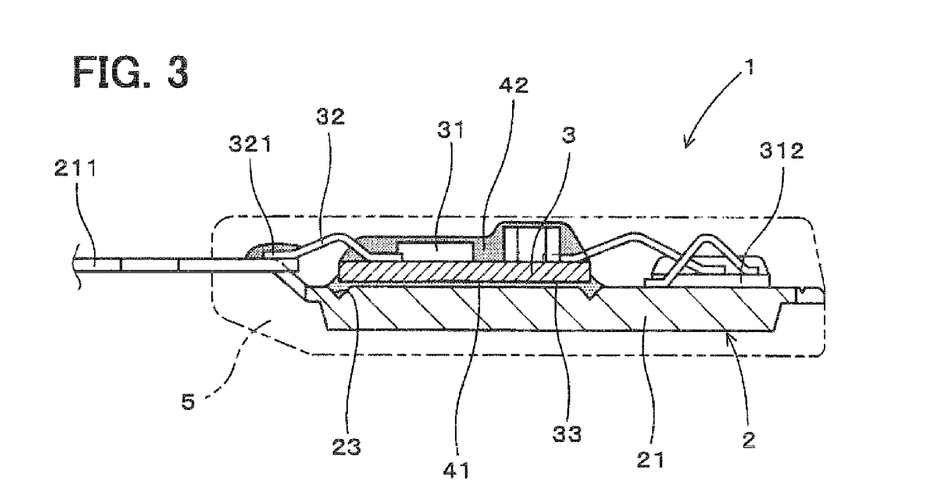
FIG. 3 is a cross-sectional view of the resin-sealed electronic device.
Figure 10:
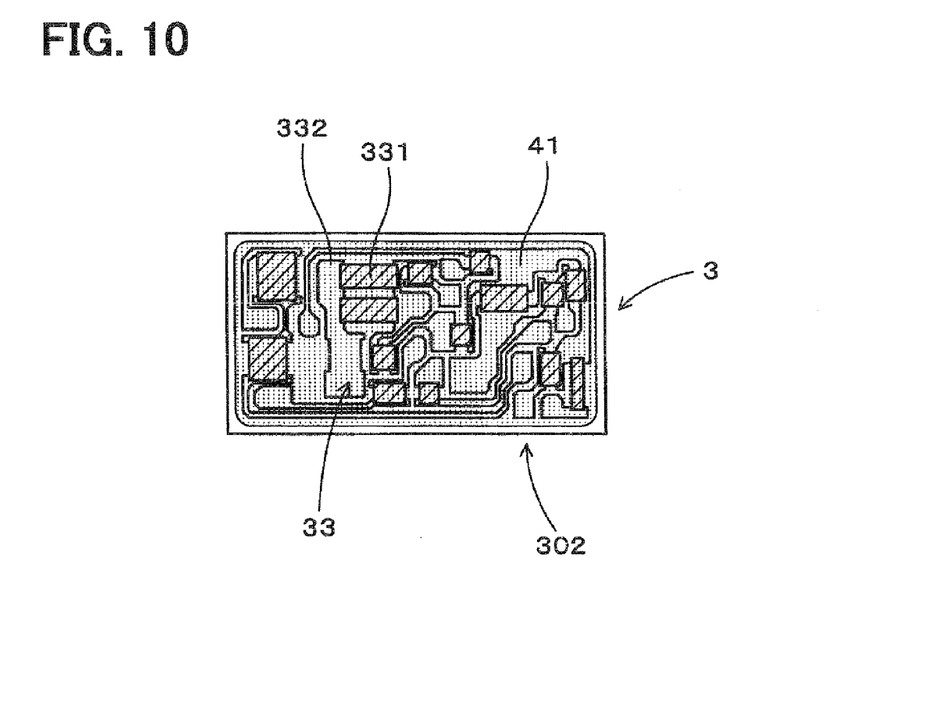
FIG. 10 is a plane view showing a lower surface of the metal frame.

As shown in FIG. 3, the metal frame 2 attached with the electronic substrate 3 and the switching section 312 is sealed with the molded resin 5. The molded resin 5 covers the whole frame body 21, all the circuit elements 31, all the bonding wires 32, and end portions of the conductive pins 22 and the ground pin 211. As shown in FIG. 10, the resistor pattern 33 disposed on the lower surface 302 of the electronic substrate 3 includes thick film resistors 331 and a wiring pattern 332 for connecting the thick film resistors 331.

In an example shown in FIG. 5, the electronic substrate 3 has a thickness about 0.8 mm, and a rising height H of the fillet part 411, which is formed at the lower side of the side surface 304, is equal to or less than about 0.5 mm, for example. The rising height H of the fillet part 411 is set so that the upper side of the side surface 304, which is directly held by the molded resin 5, has a height equal to or more than about 0.1 mm.

A method of manufacturing the igniter 1 will now be described. At first, the groove 23 is formed on the surface of the metal frame 2. As shown in FIG. 10, the adhesive agent 41 is applied to the whole lower surface 302 of the electronic substrate 3 to cover the whole resistor pattern 33. The adhesive agent 41 is made of a silicone adhesive, for example. As shown in FIG. 5, the lower surface 302 of the electronic substrate 3 is arranged to face the surface of the metal frame 2 through the adhesive agent 41, and the electronic substrate 3 is pressed to the metal frame 2. Thereby, the flowing end portion of the adhesive agent 41 flows out from the lower surface 302, and flows to the side surface 304 of the electronic substrate 3 and the surface of the metal frame 2. The flowing end portion of the adhesive agent 41 is stored in the groove 23. Thus, the flowing end portion is restricted from flowing to the upper portion of the side surface 304. When the adhesive agent 41 is cured, the electronic substrate 3 is fixed to the metal frame 2, and the fillet part 411 having an approximately triangular shape is formed at the lower portion of the side surface 304.

Due to the groove 23, the adhesive agent 41 can flow to the lower portion of the side surface 304 of the electronic substrate 3, and the adhesive agent 41 does not spread on the metal frame 2 beyond the groove 23. Additionally, the adhesive agent 41 is applied to the lower surface 302 of the electronic substrate 3. Thus, even when the electronic device 3 is out of position with respect the metal frame 2, the lower surface 302 is covered with the adhesive agent 41.

After the electronic substrate 3 applied with the adhesive agent 41 is disposed on the metal frame 2, the adhesive agent 41 may too spread out on the surface of the metal frame 2. Thus, it is preferred that the adhesive agent 41 is cured in short time (e.g., within about 30 minutes) after the electric substrate 3 is disposed on the metal frame 2.

The bonding agent 42 is applied at the circuit elements 31 (e.g., the IC 311, the switching section 312, the capacitors 313, and the diodes 314) and the connecting portion 321 of the wire 32, to cover the surface of the circuit elements 31 and the surface of the connecting portion 321. After the bonding agent 42 is applied, the bonding agent 42 is cured in short time.

The metal frame 2 attached with the electronic substrate 3 is sealed by the molded resin 5. Specifically, the whole frame body 21, all the circuit elements 31, all the wires 32, the end portions of the conductive pins 22, and the end portions of the ground pin 221 are covered with the molded resin 5. Thus, as shown in FIG. 1, the molded resin 5 holds the upper portion of the side surface 304 of the electronic substrate 3, and holds the wiring part 30 including the circuit elements 31 and the wires 32 through the bonding agent 42.

The lower surface 302 of the electronic substrate 3 has the resistor pattern 33. The adhesive agent 41 is disposed between the lower surface 302 of the electronic substrate 3 and the surface of the metal frame 2 to insulate the resistor pattern 33 from the metal frame 2, and thereby the resistor pattern 33 is protected. Additionally, the adhesive agent 41 is disposed from the lower surface 302 of the electronic substrate 3 to the lower portion of the side surface 304 of the electronic substrate 3. Thus, the adhesive agent 41 can stably protect the whole resistor pattern 33.

The adhesive agent 41 is disposed only at the lower portion of the side surface 304, and the molded resin 5 directly holds the upper portion of the side surface 304 which is not covered with the bonding agent 42. Thus, even when the igniter 1 receives a vibration or a thermal stress is generated in the molded resin 5, the molded resin 5 is not detached from an upper edge portion 305 of the electronic substrate 3.

The circuit elements 31 and the wires 32 are disposed on the upper surface 301 of the electronic substrate 3, and the circuit elements 31 and the connecting portions 321 of the wires 32 are covered with the bonding agent 42. The bonding agent 42 strongly attaches the molded resin 5 to the electric elements 31 and the connecting portions 321 of the wires 32. Thus, the molded resin 5 can hold the circuit elements 31 and the connecting portions 321 of the wires 32 through the bonding agent 42. Even when the molded resin 5 is detached from an upper edge portion 305 of the electronic substrate 3 because the igniter 1 receives a vibration or a thermal stress is generated in the molded resin 5, the detachment does not proceed to a portion where the bonding agent 42 is applied.

Even when a heating-cooling cycle is repeated due to an ignition of the engine and a thermal stress is generated in the molded resin 5 in the ignition coil 6, the molded resin 5 is restricted from being detached from the upper edge portion 305 of the electronic substrate 3, and detachment is prevented from proceeding to the portion where the bonding agent 42 is applied. Additionally, even when a vibration of the engine or a vibration of a traveling vehicle is transmitted to the igniter 1, a generation of a detachment of the molded resin 5 and a progress of the detachment can be restricted.

Because the resistor pattern 33 is disposed on the lower surface 302 of the electronic substrate 3, the electronic substrate 3 can be small. The adhesive agent 41 attached to the resistor pattern 33 is made of a silicone adhesive and is softer than the bonding agent 42 made of polyamide-imide resin. Thus, the resistor pattern 33 is reduced from being damaged.

As describe above, in the resin-sealed electronic device as the igniter 1, the molded resin 5 is restricted from being detached from the electronic substrate 3. Additionally, the igniter 1 can be easily manufactured.

Although the present invention has been fully described in connection with the preferred embodiment thereof with reference to the accompanying drawings, it is to be noted that various changes and modifications will become apparent to those skilled in the art.

What is claimed is:

1. A resin-sealed semiconductor device comprising:
a metal frame;
an electronic substrate disposed on the metal frame and including a first surface having thereon a circuit element wiring part, a second surface facing the metal frame and having thereon a resistor pattern, and a side surface arranged approximately perpendicularly to the first surface and the second surface;
an adhesive agent disposed between a surface of the metal frame and the second surface of the electronic substrate to cover the second surface and a portion of the side surface adjacent to the second surface;
a molded resin covering the metal frame and the electronic substrate, and holding a portion of the side surface that is not covered with the adhesive agent; and
a bonding agent having adhesiveness to the circuit element wiring part and the molded resin, and disposed between the circuit element wiring part and the molded resin so that the molded resin holds the circuit element wiring part through the bonding agent.

2. The resin-sealed electronic device according to claim 1, wherein:
the metal frame has an adhesive-agent storing part on the surface thereof for storing the adhesive agent that flows out from between the second surface of the electronic substrate and the surface of the metal frame; and
the adhesive-agent storing part faces the second surface.

3. The resin-sealed electronic device according to claim 2, wherein:
the adhesive-agent storing part includes a groove.

4. The resin-sealed electronic device according to claim 3, wherein:
the groove has an approximately annular shape arranged at a portion facing an outer end portion of the second surface.

5. The resin-sealed electronic device according to claim 1, wherein:
the circuit element wiring part is one of components of an igniter of an ignition coil; and
the igniter is disposed in a coil case in which a primary coil and a secondary coil are disposed.

6. The resin-sealed electronic device according to claim 1, wherein:
the metal frame includes a frame body on which the electronic substrate is disposed, a ground pin extending from the frame body, and a plurality of conductive pins arranged to be parallel to the ground pin;
the circuit element wiring part includes a plurality of circuit elements and a plurality of wires for connecting the circuit elements to each other and connecting one of the circuit elements and one of the conductive pins;
the bonding agent covers the circuit elements and connecting portions of the wires; and
the molded resin covers the frame body, the circuit elements, and the wires.

7. The resin-sealed electronic device according to claim 1, wherein:
the resistor pattern includes a plurality of thick film resistors and a wiring pattern for connecting the thick film resistors.

8. The resin-sealed electronic device according to claim 2, wherein:

the adhesive-agent storing part includes a stepped section having an approximately annular shape arranged at a portion facing an outer end portion of the second surface.

9. The resin-sealed electronic device according to claim 4, wherein:
the groove has an approximately V-shape in cross section and has a pair of inclined surfaces connecting with each other at a bottom portion of the groove.

10. The resin-sealed electronic device according to claim 9, wherein:
the bottom portion is located on an inside with respect to the outer end portion of the second surface.

11. The resin-sealed electronic device according to claim 9, wherein:
the bottom portion is located on an outside with respect to the outer end portion of the second surface.

12. The resin-sealed electronic device according to claim 1, wherein:
adhesiveness of the bonding agent to the circuit element wiring part and the molded resin is higher than adhesiveness between the circuit element wiring part and the molded resin.

13. A resin-sealed semiconductor device comprising:
a metal frame;
an electronic substrate including a first surface, a second surface arranged approximately parallel to the first surface and facing the metal frame, and a side surface arranged approximately perpendicularly to the first surface and the second surface;
an adhesive agent disposed between a surface of the metal frame and the second surface of the electronic substrate to cover the second surface and a portion of the side surface adjacent to the second surface; and
a molded resin fully covering an outside of the metal frame and an outside of the electronic substrate and holding a portion of the side surface that is not covered with the adhesive agent, wherein:

the metal frame has an adhesive-agent storing part on the surface thereof for storing the adhesive agent that flows out from between the second surface of the electronic substrate and the surface of the metal frame; and
the adhesive-agent storing part overlaps an outer end portion of the second surfaces.

14. The resin-sealed semiconductor device according to claim 13, wherein:
the adhesive-agent storing part includes a groove having an approximately annular shape to overlap an outer circumference of the second surface.

15. The resin-sealed semiconductor device according to claim 13, wherein:
the adhesive-agent storing part includes a stepped section having an approximately annular shape to overlap an outer circumference of the second surface.

16. A resin-sealed semiconductor device comprising:
an electronic substrate having a circuit element wiring part on a surface thereof,
a molded resin covering the electronic substrate; and
bonding agent having adhesiveness to the circuit element wiring part and the molded resin, and disposed between the circuit element wiring part and the molded resin so that the molded resin holds the circuit element wiring part through the bonding agent.

17. The resin-sealed semiconductor device according to claim 16, wherein:
the bonding agent is made of polyamide-imide resin.

18. The resin-sealed semiconductor device according to claim 16, further comprising:
a metal frame; and
an adhesive agent disposed between the metal frame and the electronic substrate,
wherein the molded resin fully covers an outside of the metal frame and an outside of the electronic substrate.

* * * * *